(12) United States Patent
Li et al.

(10) Patent No.: US 11,276,714 B2
(45) Date of Patent: Mar. 15, 2022

(54) DISPLAY PANEL AND ARRAY SUBSTRATE

(71) Applicants: Beijing BOE Technology Development Co., Ltd., Beijing (CN); BOE TECHNOLOGY GROUP CO., LTD., Beijing (CN)

(72) Inventors: Pan Li, Beijing (CN); Xinyin Wu, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/819,883

(22) Filed: Mar. 16, 2020

(65) Prior Publication Data

US 2021/0118917 A1 Apr. 22, 2021

(30) Foreign Application Priority Data

Oct. 22, 2019 (CN) .......................... 201921783228.7

(51) Int. Cl.
*H01L 27/12* (2006.01)

(52) U.S. Cl.
CPC ................................ *H01L 27/1244* (2013.01)

(58) Field of Classification Search
None
See application file for complete search history.

(56) References Cited

U.S. PATENT DOCUMENTS

| 2007/0269936 | A1* | 11/2007 | Tanaka | G02F 1/13458 438/133 |
| 2019/0391436 | A1* | 12/2019 | Yoshida | G09F 9/30 |
| 2020/0273919 | A1* | 8/2020 | Ding | H01L 27/3265 |

* cited by examiner

*Primary Examiner* — Steven M Christopher
(74) *Attorney, Agent, or Firm* — Thomas | Horstemeyer, LLP

(57) ABSTRACT

The present disclosure relates to an array substrate that includes a first metal layer, an insulating layer, and a second metal layer. The first metal layer includes at least one first wire. The first wire has an overlapping section and a connecting section connected to both ends of the overlapping section, and an extending direction of the overlapping section is different from an extending direction of the connecting section. The insulating layer covers the first metal layer, and the region of the insulating layer corresponding to the first wire is a convex ridge protruding in a direction away from the first metal layer. The second metal layer is provided on a side of the insulating layer facing away from the first metal layer and includes at least one second wire that intersects the convex ridge in the area of the convex ridge corresponding to the overlapping section.

20 Claims, 4 Drawing Sheets

DISPLAY PANEL AND ARRAY SUBSTRATE

CROSS REFERENCE TO RELATED APPLICATION

This application is based upon, and claims the benefit of and priority to, Chinese Patent Application No. 201921783228.7, filed on Oct. 22, 2019, the entire contents thereof are incorporated herein by reference.

TECHNICAL FIELD

The present disclosure relates to a field of display technology and, in particular, to a display panel and an array substrate.

BACKGROUND

With the development of display technology, the requirements for display panels are getting higher and higher. In an array substrate of a display panel, circuit devices and traces are often distributed in different film layers. For two layers of metal lines crossing in a space, the two layers are generally separated by an insulating layer. However, if the insulating layer is thin, the area of the insulating layer corresponding to the lower metal wire will form a corresponding bump, so that the upper metal needs to climb to cross the lower metal wire, and the upper metal wire is easily broken at the climbing position, causing a disconnection that affects normal operation of the display panel.

It should be noted that the information disclosed in the background section above is only used to enhance the understanding of the background of the present disclosure, and therefore may include information that does not constitute the prior art known to those of ordinary skill in the art.

SUMMARY

An aspect of the present disclosure is to overcome the above-mentioned shortcomings of the prior art, and to provide a display panel and an array substrate that can reduce the risk of metal wires breaking at a climbing position.

According to an aspect of the present disclosure, there is provided an array substrate including:

a first metal layer comprising at least one first wire which has an overlapping section and a connecting section connected to both ends of the overlapping section, where an extending direction of the overlapping section and an extending direction of the connecting section are different;

an insulating layer covering the first metal layer, and a region of the insulating layer corresponding to the first wire being a convex ridge protruding in a direction away from the first metal layer; and a second metal layer provided on a side of the insulating layer facing away from the first metal layer, and comprising at least one second wire which intersects the convex ridge in a region of the convex ridge corresponding to the overlapping section.

In an exemplary embodiment of the present disclosure, each of both sides of the overlapping section has a recess region recessed inward.

In an exemplary embodiment of the present disclosure, one side of the overlapping section has a recess region recessed inward, and the other side of the overlapping section has a protrusion region protruding outward, where the protrusion region is smaller than the recess region.

In an exemplary embodiment of the present disclosure, at least one side of a region of the second wire corresponding to the overlapping section has a recess region recessed inward.

In an exemplary embodiment of the present disclosure, one side of the region of the second wire corresponding to the overlapping section has a recess region recessed inward, and the other side of the region has a protrusion region protruding outward, and an orthographic projection of the overlapping section on the second metal layer covers a partial area of the protrusion region and an entire area of the recess region.

In an exemplary embodiment of the present disclosure, profiles of the recess region and the protrusion region are at least one of a curve and a polygonal line.

In an exemplary embodiment of the present disclosure, the connecting sections at both ends of the overlapping section extend along two parallel straight line trajectories parallel to each other.

In an exemplary embodiment of the present disclosure, the connecting sections at both ends of the overlapping section extend along a same straight line trajectory.

In an exemplary embodiment of the present disclosure, the second wire is perpendicular to the connecting sections.

In an exemplary embodiment of the present disclosure, the number of the first conductive wire is plural, at least part of the first wires serve as gate lines, at least part of the first wires serve as common electrode lines, the number of the second wire is plural, and at least part of the second wires serve as data lines.

In an exemplary embodiment of the present disclosure, the gate lines and the data lines are staggered laterally and longitudinally to form a plurality of pixel regions, and the array substrate further comprises:

a plurality of thin film transistors arranged in an array and provided in each of the pixel regions in a one-to-one correspondence, a same one of the gate lines being connected to gates of the thin film transistors in a same row, and a same one of the data lines being connected to sources of the thin film transistors in a same column;

a plurality of pixel electrodes arranged in an array and provided in each of the pixel regions in a one-to-one correspondence, and connected to drains of the thin film transistors in the pixel regions; and a plurality of common electrodes arranged in an array, and disposed on a same layer as the first metal layer, and a same one of the common electrode lines being connected to the common electrodes in a same row.

In an exemplary embodiment of the present disclosure, an area where the gate lines are connected to the gates protrudes toward the gates and is connected to the gates.

According to an aspect of the present disclosure, there is provided a display panel, comprising the array substrate according to any one of the above.

It should be understood that the above general description and the following detailed description are merely exemplary and explanatory, and should not limit the present disclosure.

BRIEF DESCRIPTION OF THE DRAWINGS

The drawings herein are incorporated in and constitute a part of this specification, illustrate embodiments consistent with the present disclosure, and together with the description serve to explain the principles of the present disclosure. Understandably, the drawings in the following description are just some embodiments of the present disclosure. For those of ordinary skill in the art, other drawings can be obtained based on these drawings without creative efforts.

DETAILED DESCRIPTION

Figure 1:
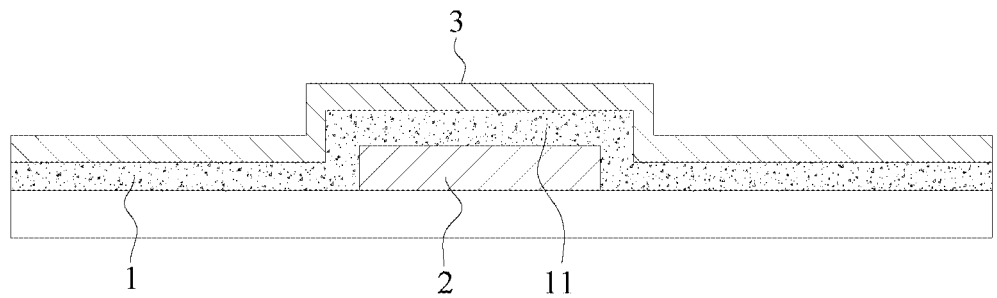
FIG. 1 is a partial cross-sectional view of an array substrate of the present disclosure.

Example embodiments will now be described more fully with reference to the accompanying drawings. However, the example embodiments can be implemented in various forms and should not be construed as limited to the embodiments set forth herein. Rather, these embodiments are provided so that this disclosure will be thorough and complete, and will fully convey the concept of the example embodiments to those skilled in the art. The same reference numerals in the drawings denote the same or similar structures, and thus their detailed descriptions will be omitted. In addition, the drawings are merely schematic illustrations of the present disclosure and are not necessarily drawn to scale.

Although relative terms such as "up" and "down" are used in this specification to describe the relative relationship between one component and another component of the icon, these terms are used in this specification for convenience only, for example, according to directions of the examples in the drawings. It can be understood that if the device of the icon is turned upside down, the component in the "above" will become the component in the "below". When a structure is "on" another structure, it may mean that a structure is integrally formed on another structure, or that a structure is "directly" arranged on another structure, or that a structure is "indirectly" arranged on another structure through further another structure.

The terms "a", "an", "the", "said", and "at least one" are used to indicate the presence of one or more elements, components, etc. The terms "include" and "having" are used to mean open-ended included means, and refer to there can be other elements, components, etc. in addition to the listed elements, components, etc. The terms "first" and "second" are used only as markers or labels, not for limiting the number of objects.

Figure 7:
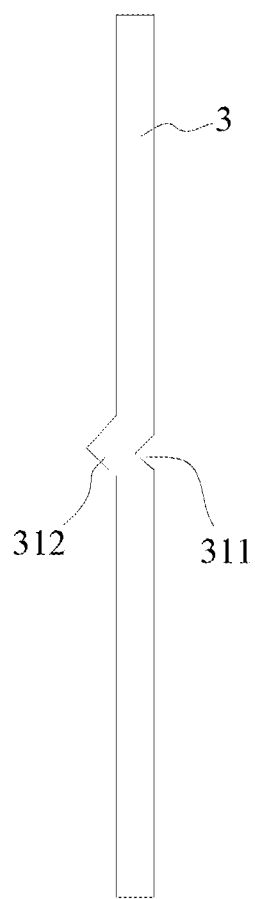
FIG. 7 is a schematic diagram of the second wire in a fifth embodiment of the array substrate of the present disclosure.

An embodiment of the present disclosure provides an array substrate. As shown in FIGS. 1 and 7, the array substrate includes a first metal layer, an insulating layer 1, and a second metal layer.

The first metal layer includes at least one first wire 2. The first wire 2 has an overlapping section 21 and a connecting section 22 connected to both ends of the overlapping section 21. An extending direction of the overlapping section 21 and an extending direction of the connecting section 22 are different. The insulating layer 1 covers the first metal layer, and a region of the insulating layer 1 corresponding to the first wire 2 is a convex ridge 11 protruding in a direction away from the first metal layer.

The second metal layer is disposed on a side of the insulating layer 1 facing away from the first metal layer, and the second metal layer includes at least one second wire 3 which intersects the convex ridge 11 in a region of the convex ridge 11 corresponding to the overlapping section 21.

In the array substrate according to the embodiment of the present disclosure, the convex ridge 11 exists in the region of the insulating layer 1 corresponding to the first wire 2, and the second wire 3 intersects the convex ridge 11, so it is necessary to climb the convex ridge 11. However, the extending direction of the overlapping section 21 and the extending direction of the connecting section 22 of the first wire 2 in the present disclosure are different, and a shape of the convex ridge 11 is the same as that of the first wire 2, that is, an extending direction of an area of the convex ridge 11 corresponding to the overlapping section 21 and an extending direction of an area of the convex ridge 11 corresponding to the connecting section 22 are also different. Further, the areas of the second wire 3 and the convex ridge 11 corresponding to the overlapping section 21 intersect with each other. As compared with the extending directions of the overlapping section 21 and the connecting section 22 being the same, the length of an area that the second wire 3 intersects the convex ridge 11 may increase, which makes the second wire less likely to break due to climbing and reduces the risk of disconnection, thereby guaranteeing a display effect.

The insulating layer 1 may be a single-layer or multi-layer structure so long as it is an insulating material and can separate the first metal layer and the second metal layer, for example. The number of the first wires 2 in the first metal layer may be plural, and the first wires 2 are arranged at intervals. The number of the second wires 3 in the second metal layer may be plural, and the second wires 3 may be arranged at intervals. The types of the first conducting wire 2 and the second conducting wire 3 are not particularly limited herein. Each of the first conducting wires 2 is not limited to the same kind of conducting wire, and the second conducting wires 3 are limited to the same kind of conducting wire.

In the same first conductor 2, the number of overlapping sections 21 may be plural, and both ends of each overlapping section 21 are connected to the connecting section 22, and two adjacent overlapping sections 21 may share one connecting section 22. Of course, a plurality of connecting sections 22 may be provided between two adjacent overlapping sections 21 instead of sharing one connecting section 22. In addition, on an extension track of the first wire 2, in addition to the overlapping sections 21 and the connecting sections 22, other parts may be included and it is not necessary to consist of only the overlapping sections 21 and the connecting sections 22.

Figure 3:
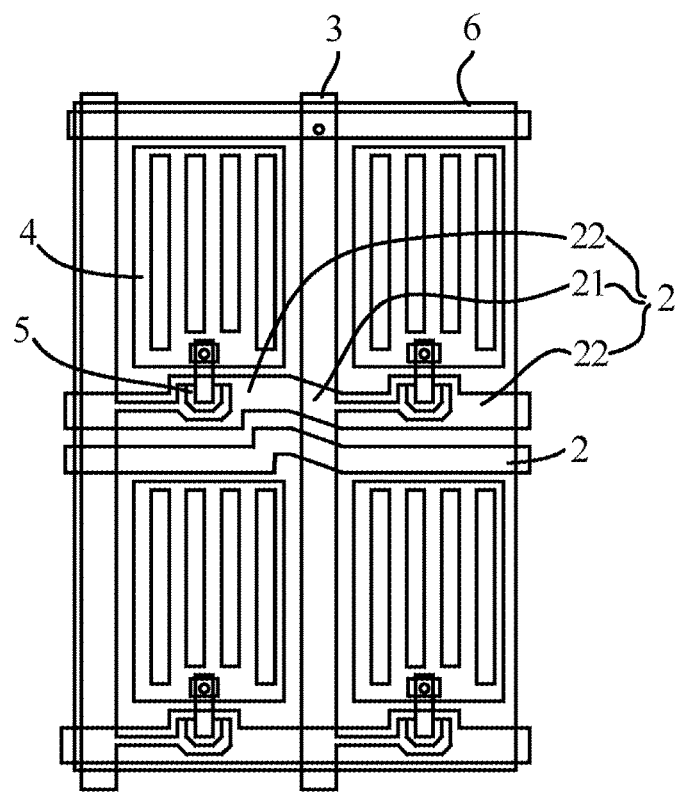
FIG. 3 is a schematic diagram of a second embodiment of the array substrate of the present disclosure.
Figure 4:
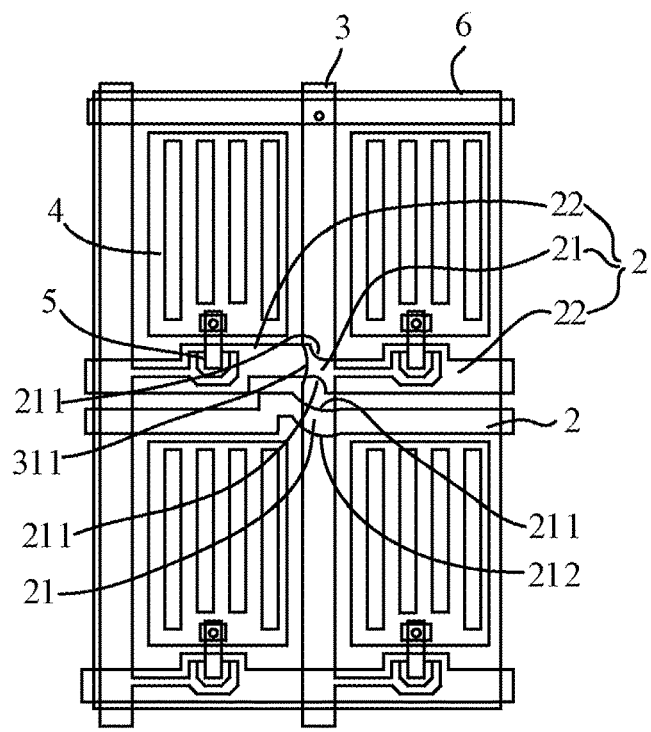
FIG. 4 is a schematic diagram of a third embodiment of the array substrate of the present disclosure.
Figure 5:
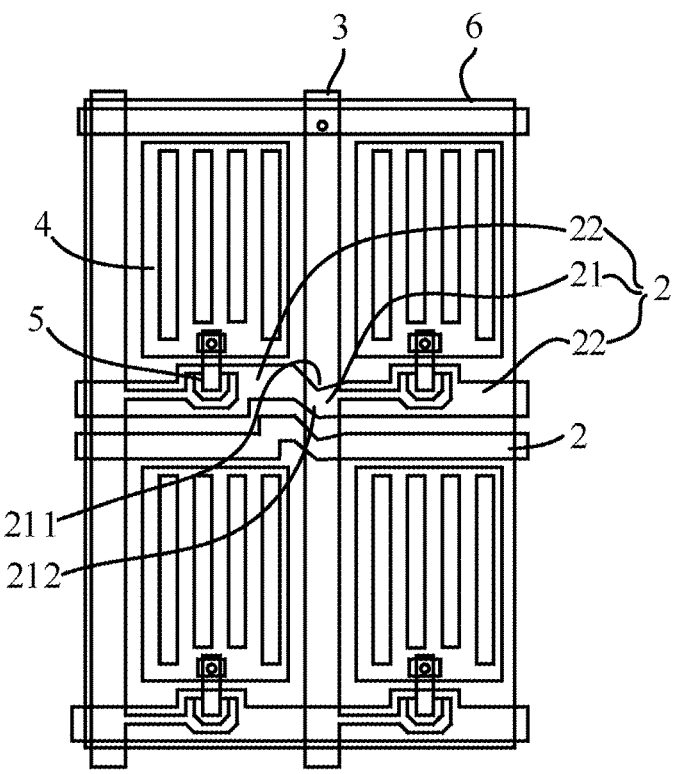
FIG. 5 is a schematic diagram of a fourth embodiment of the array substrate of the present disclosure.

As shown in FIGS. 3-5, the array substrate according to an embodiment of the present disclosure further includes a plurality of pixel electrodes 4 distributed in an array, a plurality of thin film transistors 5 distributed in an array, and a plurality of common electrodes 6 distributed in an array. Each of the drains of the thin film transistors 5 is connected to a corresponding one of the pixel electrodes 4, and the common electrodes 6 and the pixel electrodes 4 are directly opposite to each other and located in different film layers.

The numbers of the first wires 2 and the second wires 3 are plural, respectively. At least part of the first wires 2 are gate lines and common electrode lines, the gate lines being connected to gates of the thin film transistors 5 in a same row, and the common electrode lines being connected to the common electrodes in a same row. At least part of the second wires 3 may be data lines connected to the source of the same thin film transistor 5, and of course, it may be another wire.

The gate lines and the data lines are staggered laterally and longitudinally to form a plurality of pixel regions. Each of the thin film transistors 5 is provided in each pixel area in a one-to-one correspondence. A same one of the gate lines is connected to gates of the thin film transistors 5 in a same row, and a same one of the data lines being connected to sources of the thin film transistors 5 in a same column. Each of the pixel electrodes 4 is provided in each of the pixel regions in a one-to-one correspondence, and connected to drains of the thin film transistors 5 in the pixel regions. Each common electrode 6 is disposed on the same layer as the first metal layer, and the same common electrode line is connected to the same row of common electrodes 6. An area where the gate line is connected to the gate protrudes toward the gate and is connected to the gate.

Further, the gate, the first metal layer, and the common electrode 6 of each of the thin film transistors 5 may be disposed in the same layer, that is, the gate, the first metal layer, and the common electrode 6 are disposed in different areas of the same film layer. The source, the drain, the second metal layer, and the pixel electrode 4 of each of the thin film transistors 5 are disposed in the same layer, and the source, the drain, the second metal layer, and the pixel electrode 4 are different areas of the same film layer.

Figure 6:
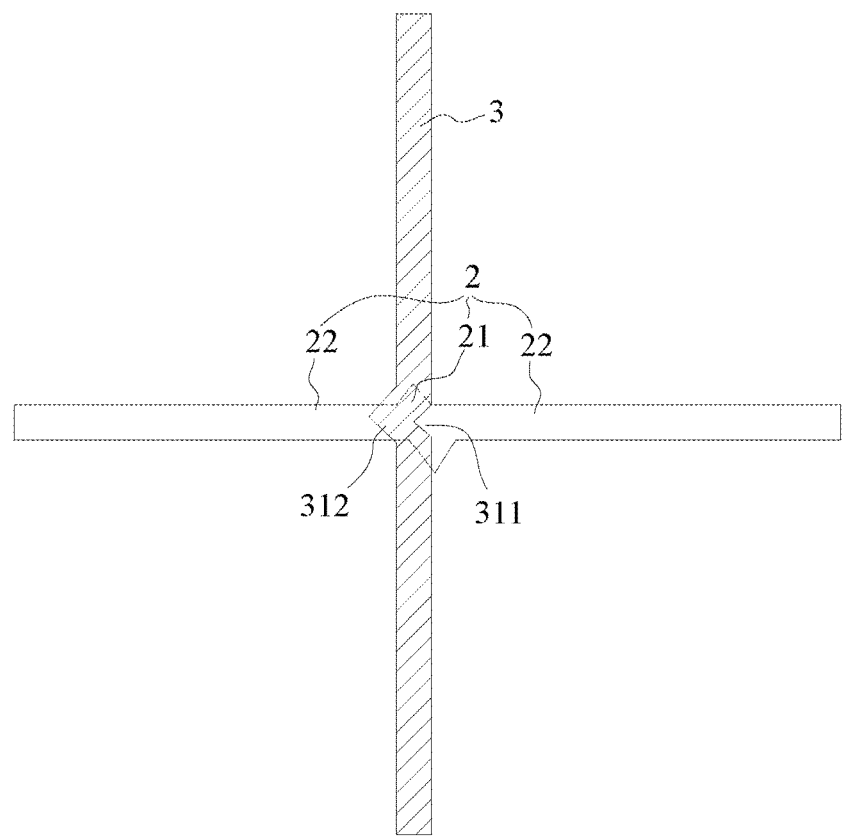
FIG. 6 is a schematic diagram of the first wire intersecting with the second wire in a fifth embodiment of the array substrate of the present disclosure.

Further, as shown in FIG. 4 and FIG. 5, in order to reduce parasitic capacitance of an overlapping area of the first conducting wire 2 and the second conducting wire 3, at least one side of the overlapping section 21 may be recessed inward to form a first recess region 211, thereby reducing the area of the second wire 3 corresponding to the overlapping section 21 without reducing the length of the overlapping section 21, and reducing the parasitic capacitance. Of course, a side of the overlapping section 21 opposite to the first recess region 211 may also protrude outward to form the first protrusion region 212. As long as the area is smaller than the first recess region 211, the parasitic capacitance may also be reduced. As shown in FIG. 6 to FIG. 7, at least one side of the area of the second wire 3 corresponding to the overlapping section 21 may recess inward to form a second recess region 311, which may reduce the above-mentioned parasitic capacitance. In addition, the side of the second wire 3 may also be protruded outward to form a second protrusion region 312, as long as the area of the second wire 3 corresponding to the overlapping section 21 is not increased.

Figure 2:
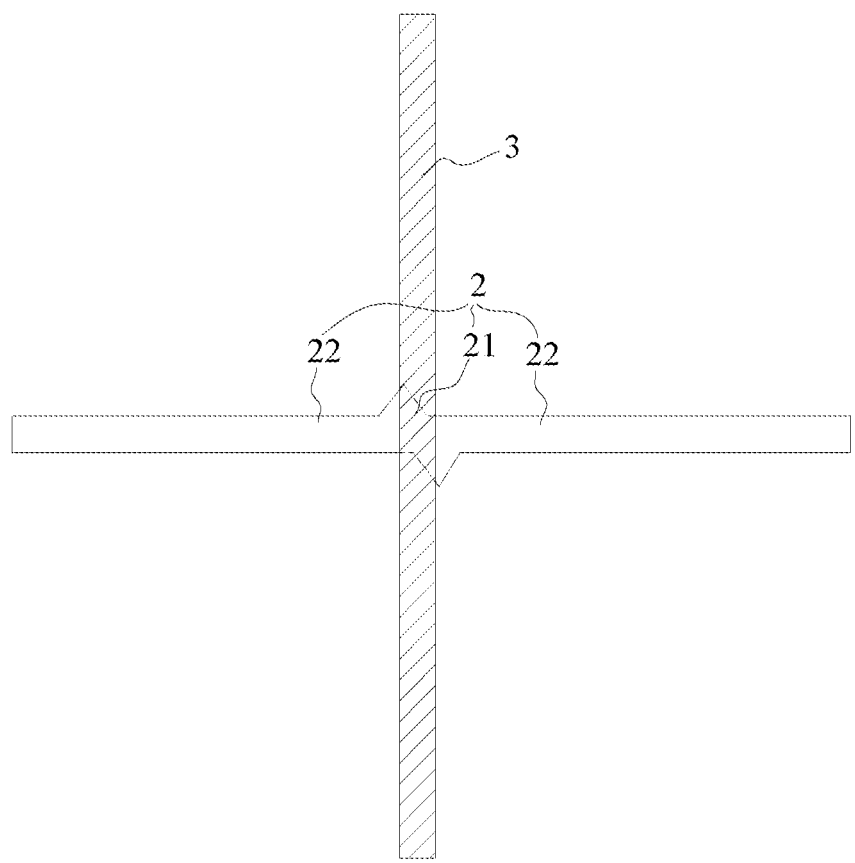
FIG. 2 is a schematic diagram of a first wire intersecting with a second wire in a first embodiment of the array substrate of the present disclosure.

Of course, as shown in FIG. 2 and FIG. 3, the sides of the first wire 2 and the second wire 3 may not be recessed inward, although the area of the second wire 3 corresponding to and the overlapping section 21 may be increased so long as the increase is smaller than a specified range, where the specified range can be 5%, 10%, and so on.

The profiles of the first recess region 211 and the second recess region 311 may be arc-shaped or have other curved shapes. Of course, the profiles may also be polygonal lines. However, the profiles of the first recess region 211 and the second recess region 311 may be the same or different. The profiles of the first protrusion region 212 and the second protrusion region 312 may also be curved or polygonal lines, which will not be described in detail here.

The second wire 3 is perpendicular to the connecting section 22 and not perpendicular to the overlapping section 21. The connecting sections 22 at both ends of the overlapping section 21 are staggered in the length direction of the second wire 3. For example, the connecting sections 22 at both ends of the overlapping section 21 may extend along two parallel straight line trajectories. In addition, the connecting sections 22 at both ends of the overlapping section 21 may extend along the same straight line trajectory.

The following describes several embodiments of the array substrate of the present disclosure by way of example:

First Embodiment of the Disclosure

As shown in FIG. 2, the two sides of the second wire 3 are straight line structures parallel to each other, and the two sides of the overlapping section 21 of the first wire 2 may be straight line structures parallel to each other, and the overlapping section 21 extends along a straight line. The connecting sections 22 at both ends of the overlapping section 21 may extend along the same straight line trajectory and be perpendicular to the second wire 3. The overlapping section 21 is not perpendicular to the second wire 3. Both ends of the overlapping section 21 protrude from the sides of the connecting section 22.

Second Embodiment of the Disclosure

As shown in FIG. 3, at least one gate line and at least one common electrode line may be used as the first wire 2, and at least one data line may be used as the second wire 3. The two sides of the second conducting wire 3 are straight line structures parallel to each other. The sides of the overlapping section 21 of the first conducting wire 2 may be straight line structures parallel to each other. The overlapping section 21 extends along a straight line. The connecting sections 22 at both ends of the overlapping section 21 may be staggered in the length direction of the second wire 3 and may be perpendicular to the second wire 3. The overlapping section 21 is not perpendicular to the second wire 3.

Third Embodiment of the Disclosure

As shown in FIG. 4, at least one gate line and at least one common electrode line may be used as the first wire 2, and at least one data line may be used as the second wire 3. The two sides of the second conducting wire 3 are straight line structures parallel to each other. In a first wire 2 as a gate line, both sides of the overlapping section 21 have recess regions that are recessed inward, that is, there are two first recess regions 211. At the same time, in a first wire 2 serving as a common electrode line, one side of the overlapping section 21 has a recess region that is recessed inward, that is, the first recess region 211, and the other side has a first protrusion region 212 that is protruded outward. The area of the first protrusion region 212 is smaller than that of the first recess region 211, thereby reducing the area of the overlapping area.

Fourth Embodiment of the Disclosure

As shown in FIG. 5, at least one gate line and at least one common electrode line may be used as the first wire 2, and at least one data line may be used as the second wire 3. The two sides of the second conducting wire 3 are straight line structures parallel to each other. For the first lead 2 as the gate line and the common electrode line, one side of the overlapping section 21 has a recess region that is recessed inward, that is, the first recess region 211. The other side has a first protrusion region 212 that protrudes outward. The area of the first protrusion region 212 is smaller than that of the first recess region 211, thereby reducing the area of the overlapping area. Specifically, the first recess region 211 and the first protrusion region 212 may be formed by bending the overlapping section 21 to the same side, and a bending angle of the first recess region 211 is greater than a bending angle of the first protrusion region 212, such that the area of the first protrusion region 212 is smaller than that of the first recess region 211.

Fifth Embodiment of the Disclosure

As shown in FIGS. 6 and 7, at least one data line may be used as the second wire 3, and at least one gate line and at least one common electrode line may be used as the first wire 2. One side of an area of the second wire 3 corresponding to the overlapping section 21 has a recess region that is recessed inward, that is, a second recess region 311. The other side of the second wire 3 has a second protrusion region 312 that protrudes outward. The second recess region 311 and the second protrusion region 312 are formed by bending the second wire 3 to the same side, and the shape of the second recess region 311 and the second protrusion region 312 may be a triangle, an arc, etc., which is not particularly limited herein. The orthographic projection of the overlapping section 21 of the first wire 2 on the second metal layer covers a part of the second protrusion region 312 and the entire area of the second recess region 311, and a part of the orthographic projection of the overlapping section 21 on the second metal layer overlaps with the second wire 3, thereby reducing the overlapping area.

An embodiment of the present disclosure also provides a display panel, which may include the above-mentioned array substrate, and the display panel may be used for a terminal device such as a mobile phone or a tablet computer. Since the display panel adopts the array substrate of the above embodiment, the two have the same beneficial effects, and details of the benefits are not described herein again.

In the display panel and the array substrate of the present disclosure, there is the convex ridge in the area of the insulating layer corresponding to the first wire, and the second wire intersects the convex ridge, and thus needs to climb on the convex ridge. However, the extending direction of the overlapping section of the first wire and the extending direction of the connecting section in the present disclosure are different, and the shape of the convex ridge is the same as that of the first wire, that is, the extending directions of the areas of the convex ridge corresponding to the overlapping section and the connecting section are also different, and the areas of the second wire and the convex ridge corresponding to the overlapping section intersect with each other. Comparing with that, the extending directions of the overlapping section and the connecting section are the same, the length of an area that the second wire intersects the convex ridge may increase, which makes the second wire less likely to break due to climbing and reduces the risk of disconnection.

Those skilled in the art will readily think of other embodiments of the present disclosure after considering the specification and practicing the utility model disclosed herein. This application is intended to cover any variations, uses, or adaptations of this disclosure that conform to the general principles of this disclosure and include the common general knowledge or conventional technical means in the technical field not disclosed by this disclosure. It is intended that the specification and examples be considered as exemplary only, with a true scope and spirit of the disclosure being indicated by the following claims.

What is claimed is:

1. An array substrate, comprising:
   a first metal layer comprising at least one first wire which has an overlapping section and a connecting section connected to both ends of the overlapping section, wherein an extending direction of the overlapping section and an extending direction of the connecting section are different;
   an insulating layer covering the first metal layer, a region of the insulating layer corresponding to the first wire being a convex ridge protruding in a direction away from the first metal layer; and
   a second metal layer provided on a side of the insulating layer facing away from the first metal layer, the second metal layer comprising at least one second wire which intersects the convex ridge in a region of the convex ridge corresponding to the overlapping section,
   wherein an orthographic projection of the second wire on the insulating layer is not perpendicular to an orthographic projection of the overlapping section on the insulating layer.

2. The array substrate according to claim 1, wherein each of both sides of the overlapping section has a recess region recessed inward.

3. The array substrate according to claim 1, wherein one side of the overlapping section has a recess region recessed inward, and the other side of the overlapping section has a protrusion region protruding outward, the protrusion region being smaller than the recess region.

4. The array substrate according to claim 1, wherein at least one side of a region of the second wire corresponding to the overlapping section has a recess region recessed inward.

5. The array substrate according to claim 4, wherein one side of the region of the second wire corresponding to the overlapping section has a second recess region recessed inward, the other side of the region has a protrusion region protruding outward, and an orthographic projection of the overlapping section on the second metal layer covers a partial area of the protrusion region and an entire area of the second recess region.

6. The array substrate according to claim 5, wherein profiles of the second recess region and the protrusion region are at least one of: a curve and a polygonal line.

7. The array substrate according to claim 1, wherein the connecting sections at both ends of the overlapping section extend along two parallel straight line trajectories parallel to each other.

8. The array substrate according to claim 1, wherein the connecting sections at both ends of the overlapping section extend along a same straight line trajectory.

9. The array substrate according to claim 1, wherein the second wire is perpendicular to the connecting sections.

10. The array substrate according to claim 1, wherein:
    the first wire is one of a plurality of first wires, at least part of the first wires serving as gate lines, and at least part of the first wires serving as common electrode lines; and
    the second wire is one of a plurality of second wires, at least part of the second wires serving as data lines.

11. The array substrate according to claim 10, wherein the gate lines and the data lines are staggered laterally and longitudinally to form a plurality of pixel regions, and the array substrate further comprises:
    a plurality of thin film transistors arranged in an array and provided in each of the pixel regions in a one-to-one correspondence, a same one of the gate lines being connected to gates of the thin film transistors in a same row, and a same one of the data lines being connected to sources of the thin film transistors in a same column;

a plurality of pixel electrodes arranged in an array and provided in each of the pixel regions in a one-to-one correspondence, and connected to drains of the thin film transistors in the pixel regions; and a plurality of common electrodes arranged in an array, and disposed on a same layer as the first metal layer, and a same one of the common electrode lines being connected to the common electrodes in a same row.

12. The array substrate according to claim 11, wherein an area where the gate lines are connected to the gates protrudes toward the gates and is connected to the gates.

13. A display panel, comprising:

an array substrate, comprising:

a first metal layer comprising at least one first wire which has an overlapping section and a connecting section connected to both ends of the overlapping section, wherein an extending direction of the overlapping section and an extending direction of the connecting section are different;

an insulating layer covering the first metal layer, a region of the insulating layer corresponding to the first wire being a convex ridge protruding in a direction away from the first metal layer; and a second metal layer provided on a side of the insulating layer facing away from the first metal layer, the second metal layer comprising at least one second wire which intersects the convex ridge in a region of the convex ridge corresponding to the overlapping section, wherein an orthographic projection of the second wire on the insulating layer is not perpendicular to an orthographic projection of the overlapping section on the insulating layer.

14. The display panel according to claim 13, wherein each of both sides of the overlapping section has a recess region recessed inward.

15. The display panel according to claim 13, wherein one side of the overlapping section has a recess region recessed inward, and the other side of the overlapping section has a protrusion region protruding outward, the protrusion region being smaller than the recess region.

16. The display panel according to claim 13, wherein at least one side of a region of the second wire corresponding to the overlapping section has a recess region recessed inward.

17. The display panel according to claim 16, wherein one side of the region of the second wire corresponding to the overlapping section has a second recess region recessed inward, the other side of the region has a protrusion region protruding outward, and an orthographic projection of the overlapping section on the second metal layer covers a partial area of the protrusion region and an entire area of the second recess region.

18. The display panel according to claim 17, wherein profiles of the second recess region and the protrusion region are at least one of: a curve and a polygonal line.

19. The display panel according to claim 13, wherein the connecting sections at both ends of the overlapping section extend along two parallel straight line trajectories parallel to each other.

20. A method, comprising:

providing an array substrate, the array substrate comprising:

a first metal layer comprising at least one first wire which has an overlapping section and a connecting section connected to both ends of the overlapping section, wherein an extending direction of the overlapping section and an extending direction of the connecting section are different;

an insulating layer covering the first metal layer, a region of the insulating layer corresponding to the first wire being a convex ridge protruding in a direction away from the first metal layer; and a second metal layer provided on a side of the insulating layer facing away from the first metal layer, the second metal layer comprising at least one second wire which intersects the convex ridge in a region of the convex ridge corresponding to the overlapping section, wherein an orthographic projection of the second wire on the insulating layer is not perpendicular to an orthographic projection of the overlapping section on the insulating layer.

* * * * *